(12) United States Patent
Furujiku et al.

(10) Patent No.: US 12,405,633 B2
(45) Date of Patent: Sep. 2, 2025

(54) ELECTRONIC DEVICE

(71) Applicant: Panasonic Intellectual Property Management Co., Ltd., Osaka (JP)

(72) Inventors: Masaru Furujiku, Osaka (JP); Ryusuke Teramoto, Osaka (JP); Nobuya Higashino, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 83 days.

(21) Appl. No.: 18/370,938

(22) Filed: Sep. 21, 2023

(65) Prior Publication Data
US 2024/0012454 A1 Jan. 11, 2024

Related U.S. Application Data

(63) Continuation of application No. PCT/JP2022/008126, filed on Feb. 28, 2022.

(30) Foreign Application Priority Data

Mar. 24, 2021 (JP) .................................. 2021-050061

(51) Int. Cl.
*G06F 1/16* (2006.01)
(52) U.S. Cl.
CPC ................ *G06F 1/1656* (2013.01)
(58) Field of Classification Search
CPC .... G06F 1/1629; G06F 1/1675; G06F 1/1679; G06F 1/1684; G06F 1/1686
(Continued)

(56) References Cited

U.S. PATENT DOCUMENTS 5,199,888 A * 4/1993 Condra ................. G06F 1/1632
361/679.55
5,768,163 A * 6/1998 Smith, II ............... G06F 1/1601
361/679.28
(Continued)

FOREIGN PATENT DOCUMENTS

IT 2016UB0507 A1 7/2017
JP 2004-040382 A 2/2004
(Continued)

OTHER PUBLICATIONS

The EPC Office Action dated Jul. 23, 2024 for the related European Patent Application No. 22774910.8.
(Continued)

*Primary Examiner* — Adrian S Wilson
(74) *Attorney, Agent, or Firm* — Renner, Otto, Boisselle & Sklar, LLP

(57) ABSTRACT

An electronic device includes a housing, an electronic component, and a cover. The housing includes a first surface including a display, a second surface intersecting the first surface, and an opening provided at a position in the first surface, the position being between the display and the second surface in a first direction intersecting the second surface. The electronic component is disposed inside the housing and exposed to an outside of the housing through the opening. The cover is disposed between the opening and the electronic component in a second direction intersecting the first surface, and moves along the first direction between a closed position and an open position.

14 Claims, 7 Drawing Sheets

(58) Field of Classification Search
USPC .................................................. 361/679.45
See application file for complete search history.

(56) References Cited

U.S. PATENT DOCUMENTS

| | | | | | |
|---|---|---|---|---|---|
| 5,801,919 | A * | 9/1998 | Griencewic | ........... | G06F 1/1616 |
| | | | | | 361/679.26 |
| 6,002,581 | A * | 12/1999 | Lindsey | ................. | G06F 1/166 |
| | | | | | 361/679.55 |
| 6,417,884 | B1 * | 7/2002 | Chang | ................. | G06F 1/1686 |
| | | | | | 348/376 |
| 6,757,160 | B2 * | 6/2004 | Moore | ................. | G06F 1/1616 |
| | | | | | 361/679.55 |
| 7,561,420 | B2 * | 7/2009 | Chueh | ................. | G06F 1/1656 |
| | | | | | 361/679.55 |
| 7,850,371 | B2 * | 12/2010 | Riley | ................. | G02B 6/3849 |
| | | | | | 439/142 |
| 8,391,000 | B2 * | 3/2013 | Saito | ................. | G06F 1/1656 |
| | | | | | 361/679.01 |
| 8,435,054 | B2 * | 5/2013 | Liu | ....................... | G06F 1/1626 |
| | | | | | 439/142 |
| 8,922,989 | B2 * | 12/2014 | Senatori | ................ | G06F 1/16 |
| | | | | | 455/410 |
| 9,054,444 | B2 * | 6/2015 | Senatori | ................ | G06F 1/1633 |
| 9,465,276 | B2 * | 10/2016 | Jonsson | ................ | G06F 1/1656 |
| 10,187,104 | B2 * | 1/2019 | Widiaman | ........... | H04B 1/3888 |
| 10,342,149 | B2 * | 7/2019 | Lu | ....................... | H05K 5/0247 |
| 10,761,404 | B2 * | 9/2020 | Leimer | ................ | G03B 11/043 |
| 11,294,260 | B2 * | 4/2022 | Park | ....................... | G06F 1/1686 |
| 2004/0263666 | A1 | 12/2004 | Tsuji et al. | | |
| 2005/0117900 | A1 | 6/2005 | Ohmori et al. | | |
| 2005/0124191 | A1 * | 6/2005 | Stanton | ............... | H01R 13/5213 |
| | | | | | 439/135 |
| 2014/0185235 | A1 * | 7/2014 | Iwamoto | ............... | G06F 1/1656 |
| | | | | | 361/679.02 |
| 2020/0393739 | A1 | 12/2020 | Kinoshita et al. | | |
| 2021/0271856 | A1 * | 9/2021 | Kanas | ................... | H04N 23/55 |
| 2024/0006797 | A1 * | 1/2024 | Furujiku | ............... | H01R 13/447 |

FOREIGN PATENT DOCUMENTS

| | | |
|---|---|---|
| JP | 2004-325519 A | 11/2004 |
| JP | 2005-017523 A | 1/2005 |
| JP | 2014-085973 A | 5/2014 |
| JP | 2020-201886 A | 12/2020 |

OTHER PUBLICATIONS

International Search Report for corresponding Application No. PCT/JP2022/008126, mailed May 17, 2022.

* cited by examiner

ELECTRONIC DEVICE

BACKGROUND

1. Technical Field

The present disclosure relates to an electronic device.

2. Description of the Related Art

Patent Literature (PTL) 1 discloses a notebook computer. PTL 1 is Unexamined Japanese Patent Publication No. 2014-085973.

SUMMARY

It is an object of the present disclosure to provide an electronic device having a high degree of freedom in placement of electronic components.

An electronic device according to an aspect of the present disclosure includes; a housing including a first surface including a display, a second surface intersecting the first surface, and an opening provided between the display in the first surface and the second surface in a first direction intersecting the second surface; an electronic component disposed inside the housing and exposed to an outside of the housing through the opening; and a cover that is disposed between the opening and the electronic component in a second direction intersecting the first surface and moves along the first direction between a closed position where the opening is closed and an open position where the opening is opened.

The present disclosure enables fabricating an electronic device having a high degree of freedom in placement of electronic components.

DETAILED DESCRIPTION

Background to Present Disclosure

Figure 1:
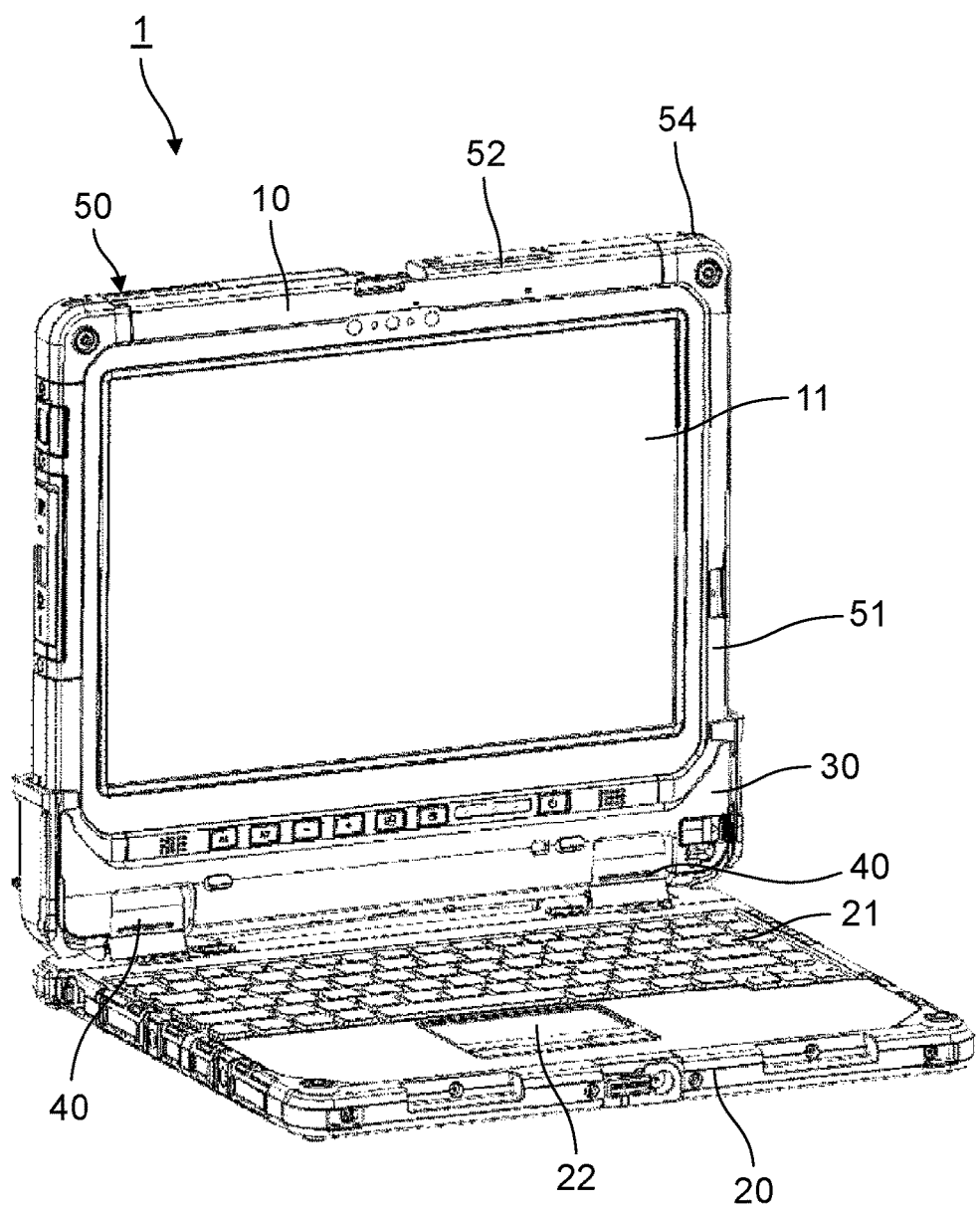
FIG. 1 is a perspective view illustrating an electronic device according to an exemplary embodiment of the present disclosure.
Figure 1:
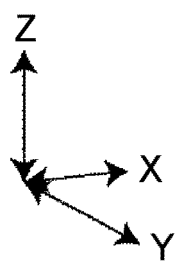

Electronic devices including notebook computers may incorporate electronic components such as cameras, microphones, and LEDs. These electronic components are typically disposed collectively on a part of an outer periphery of a display such as a liquid crystal device. Such electronic components are typically configured to be disposed inside an opening opened and closed by a cover, thereby being prevented from being exposed to the outside of a housing when not in use.

Examples of the cover that opens and closes the opening include a type of cover that slides along an outer periphery of a display. When such a cover is used, a space for accommodating the cover is required to be provided in a part adjacent to the opening in a direction along the outer periphery of the display. This configuration may restrict placement of the electronic components such that a pitch between adjacent electronic components cannot be narrowed unless a plurality of electronic components is disposed inside one opening.

The inventors of the present invention have devised an electronic device having a high degree of freedom in placement of electronic components, and have reached the invention below.

An electronic device according to a first aspect of the present disclosure includes; a housing including a first surface including a display, a second surface intersecting the first surface, and an opening provided between the display in the first surface and the second surface in a first direction intersecting the second surface; an electronic component disposed inside the housing and exposed to an outside of the housing through the opening; and a cover that is disposed between the opening and the electronic component in a second direction intersecting the first surface and moves along the first direction between a closed position where the opening is closed and an open position where the opening is opened.

The electronic device of the first aspect enables increasing a space inside the housing, the space allowing other electronic components to be mounted, by reducing a space required for moving the cover. As a result, an electronic device having a high degree of freedom in placement of electronic components can be fabricated.

An electronic device according to a second aspect of the present disclosure is configured such that the cover includes a cover body extending along the first surface, and a positioning protrusion protruding from the cover body toward an inside of the housing along the second direction, and the housing includes a positioning member disposed inwardly from the cover body in the second direction inside the housing and provided with a first recess that accommodates the positioning protrusion when the cover is located at the closed position.

The electronic device of the second aspect enables holding the cover at the closed position.

An electronic device according to a third aspect of the present disclosure is configured such that the positioning protrusion of the cover located at the closed position forms a gap with a bottom of the first recess.

The electronic device of the third aspect enables the cover to be more easily moved from the closed position toward the open position when the cover is located at the closed position.

An electronic device according to a fourth aspect of the present disclosure is configured such that the cover includes a cover body extending along the first surface, and a positioning protrusion protruding from the cover body toward an inside of the housing along the second direction, and the housing includes a positioning member disposed inwardly from the cover body in the second direction inside the housing and provided with a second recess that accommodates the positioning protrusion when the cover is located at the open position.

The electronic device of the fourth aspect enables holding the cover at the open position.

An electronic device according to a fifth aspect of the present disclosure is configured such that the positioning protrusion of the cover located at the open position forms a gap with a bottom of the second recess.

The electronic device of the fifth aspect enables the cover to be more easily moved from the open position toward the closed position when the cover is located at the open position.

An electronic device according to a sixth aspect of the present disclosure is configured such that the positioning protrusion is provided at one end of the cover body in the first direction, and the one end of the cover body in the first direction has a dimension in the second direction, the dimension being smaller than a dimension in the second direction of another end of the cover body in the first direction.

The electronic device of the sixth aspect allows the end of the cover body, the end being provided with the positioning protrusion, to be easily elastically deformed in the second direction, and thus enables the cover to be more easily moved between the closed position and the open position.

An electronic device according to a seventh aspect of the present disclosure is configured such that the cover includes a first guide protrusion provided at one end of the cover body in a third direction intersecting the first direction and the second direction, the first guide protrusion protruding from the cover body toward the inside of the housing along the second direction, and a second guide protrusion provided at another end of the cover body in the third direction, the second guide protrusion protruding from the cover body toward the inside of the housing along the second direction, the positioning member includes a first groove disposed facing the first guide protrusion in the second direction, the first groove accommodating the first guide protrusion, and a second groove disposed facing the second guide protrusion in the second direction, the second groove accommodates the second guide protrusion, and each of the first groove and the second groove extends along the first direction to guide movement of the cover in the first direction.

The electronic device of the seventh aspect enables the cover to be moved more smoothly.

An electronic device according to an eighth aspect of the present disclosure is configured such that the cover includes an operation part extending from the cover body toward the outside of the housing along the second direction, and the operation part is disposed at a position away from a center of the cover body in the third direction intersecting the first direction and the second direction.

The electronic device of the eighth aspect enables the operation part to be changed in position depending on a configuration of an electronic component, and thus enables fabricating an electronic device with a high degree of freedom in design in which electronic components having various configurations can be used.

An electronic device according to a ninth aspect of the present disclosure is configured such that the housing includes a first cutout provided in the first surface and connected to the opening from one side in the first direction with respect to the opening, the first cutout accommodating the operation part when the cover is located at the closed position, and a second cutout provided in the first surface and connected to the opening from another side in the first direction with respect to the opening, the second cutout accommodating the operation part when the cover is located at the open position.

The electronic device of the ninth aspect enables an operation range of the operation part to be expanded, and thus enables improvement in operability of the cover.

An electronic device according to a tenth aspect of the present disclosure is configured such that the cover includes a projection provided at the one end of the cover body in the first direction, the projection protruding from the cover body toward the outside of the housing along the second direction and overlapping a part around the opening of the housing when viewed along the first direction.

The electronic device of the tenth aspect enables preventing the cover from lifting.

Hereinafter, an exemplary embodiment of the present disclosure will be described with reference to the drawings. The drawings illustrate the same components that are denoted by the same reference numerals, and that will not be described as appropriate. The exemplary embodiment is an example instead of limiting the present disclosure, and thus can be appropriately changed without departing from the gist of the present disclosure.

Examples of electronic device 1 according to the present exemplary embodiment include a notebook type personal computer (in other words, a laptop PC) as illustrated in FIG. 1. Electronic device 1 includes first unit 10 and second unit 20. First unit 10 is detachably attached to second unit 20. That is, electronic device 1 is configured as a so-called detachable computer.

First unit 10 is a tablet computer having display 11. Display 11 is, for example, a liquid crystal display panel having a substantially rectangular shape, and includes a touch panel capable of receiving a user's touch operation. First unit 10 incorporates a central processing unit (CPU), a volatile storage (RAM), a nonvolatile storage (ROM, SSD, or the like), a battery, and the like. The nonvolatile storage device (ROM, SSD, or the like) stores an operating system (OS), various application programs, various data, and the like. The central processing unit (CPU) executes arithmetic processing by reading the OS, the application programs, and the various data, thereby achieving various functions.

Second unit 20 is a station to which first unit 10 is detachably attached. Second unit 20 includes input units 21, 22, socket 30, and hinges 40. Input units 21, 22 include, for example, a keyboard and a touch pad, and are configured such that a user can perform input processing.

Socket 30 detachably houses first unit 10. Socket 30 is disposed at one end in a depth direction of second unit 20 (e.g., the Y direction), and is connected to second unit 20 with hinges 40.

Hinge 40 has a rotation shaft extending along a width direction of electronic device 1 (e.g., the X direction), and socket 30 can be held at any angle with respect to second unit 20 by rotating socket 30 about the rotation shaft. For example, holding socket 30 at an angle of approximately 90 degrees with respect to second unit 20 with hinges 40 as illustrated in FIG. 1 brings first unit 10 into an open state at an angle of 90 degrees with respect to second unit 20. Additionally, holding first unit 10 at an angle of substantially 0 degrees with respect to second unit 20 with hinges 40 enables first unit 10 to be brought into a closed state. The term, "closed state", means that first unit 10 and second unit 20 face each other closely and are substantially parallel to each other.

Next, a configuration of first unit 10 will be described. FIGS. 2 to 6 each do not illustrate a part of components constituting first unit 10.

Figure 2:
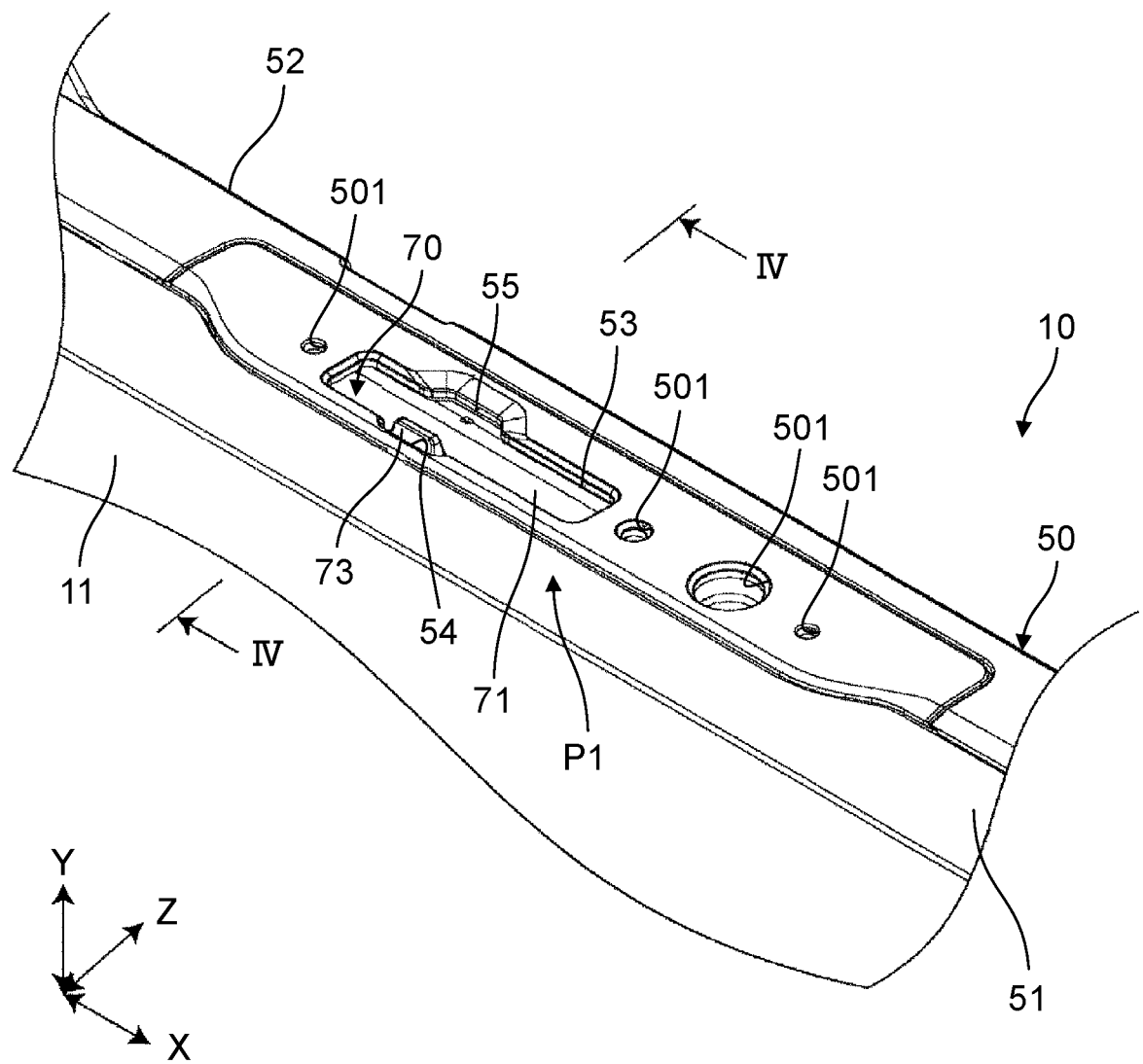
FIG. 2 is a partial perspective view illustrating a state in which a cover of a first unit of the electronic device of FIG. 1 is located at a closed position.
Figure 3:
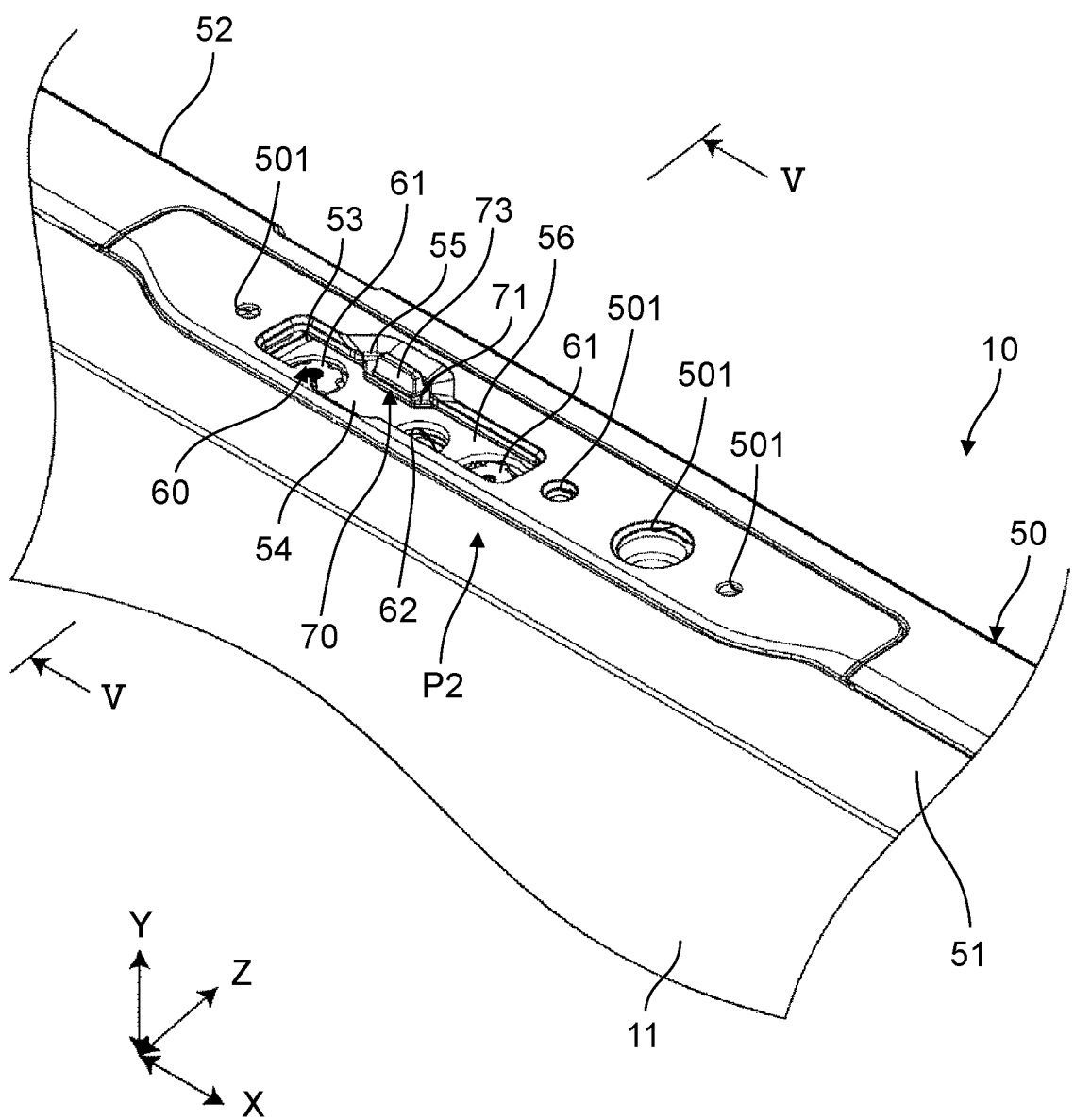
FIG. 3 is a partial perspective view illustrating a state in which the cover of the first unit of the electronic device of FIG. 1 is located at an open position.
Figure 4:
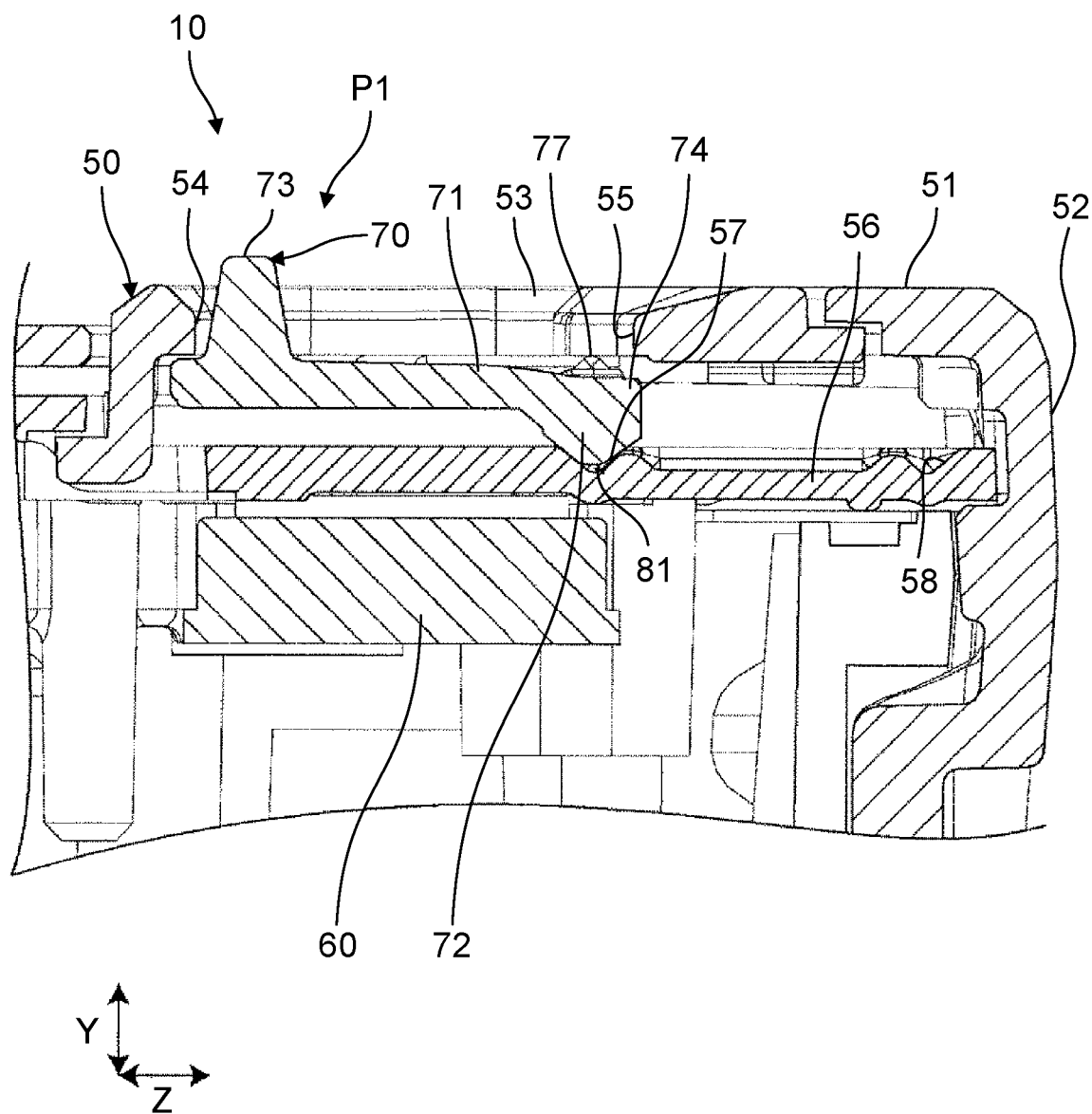
FIG. 4 is a cross-sectional view taken along line IV-IV of FIG. 2.

As illustrated in FIG. 2, first unit 10 includes housing 50 having first surface 51 and second surface 52 intersecting first surface 51, electronic component 60 (see FIG. 3), and cover 70. As illustrated in FIG. 2, housing 50 includes display 11 provided on first surface 51 and opening 53. Opening 53 is provided between display 11 on first surface 51 and second surface 52 in the first direction (e.g., in the Z direction) intersecting the second surface 52. Opening 53 in the present exemplary embodiment is disposed at an end part away from second unit 20 in first direction Z when first unit 10 is opened at an angle of approximately 90 degrees with respect to second unit 20 (see FIG. 1). As illustrated in FIG. 3, electronic component 60 is disposed inside housing 50 and exposed to the outside of housing 50 through opening 53. As illustrated in FIG. 4, cover 70 is disposed between opening 53 and electronic component 60 in the second direction (e.g., in the Y direction) intersecting first surface 51, and opens and closes opening 53 as illustrated in FIGS. 2 and 3.

As an example, housing 50 has a substantially rectangular plate shape as illustrated in FIG. 1. First surface 51 constitutes one of a pair of surfaces intersecting with a thickness direction (e.g., the Y direction) of housing 50. Second surface 52 constitutes one of a pair of side surfaces (e.g., a pair of side surfaces disposed along an XY plane) extending in the thickness direction of housing 50 and a longitudinal direction (e.g., the X direction) of first surface 51. Opening 53 has a substantially rectangular shape extending along the longitudinal direction of first surface 51.

As illustrated in FIGS. 2 and 3, in the present exemplary embodiment, the housing 50 has first cutout 54 and second cutout 55 provided in first surface 51. First cutout 54 is connected to opening 53 from one side (a side farther from second surface 52 in the present exemplary embodiment) in first direction Z with respect to opening 53. As illustrated in FIG. 2, first cutout 54 accommodates operation part 73 of cover 70 described later when cover 70 is located at closed position P1 where opening 53 is closed. Second cutout 55 is connected to opening 53 from the other side (a side closer to second surface 52 in the present exemplary embodiment) in first direction Z with respect to opening 53. As illustrated in FIG. 3, second cutout 55 accommodates operation part 73 of cover 70 when cover 70 is located at open position P2 where opening 53 is opened. Each of first cutout 54 and second cutout 55 in the present exemplary embodiment is configured to be able to accommodate a part of operation part 73.

As illustrated in FIGS. 2 and 3, a plurality of openings 501 is provided on both sides of opening 53 in the longitudinal direction of housing 50, openings 501 allowing respective electronic components (not illustrated) such as a microphone and a sensor to be exposed to the outside of housing 50 through corresponding openings 501. Openings 53, 501 are disposed at intervals in the longitudinal direction of housing 50.

Figure 5:
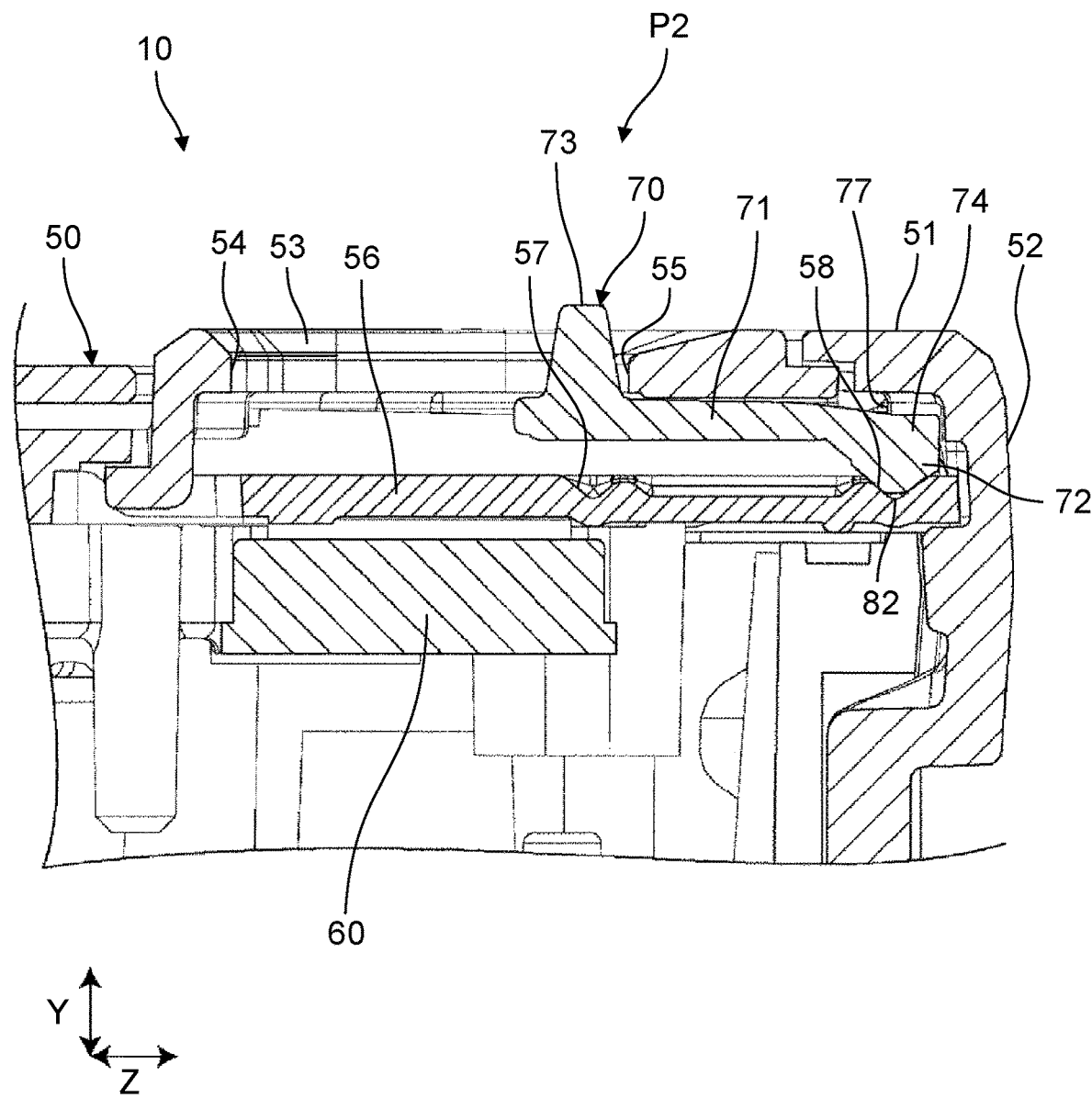
FIG. 5 is a cross-sectional view taken along line V-V of FIG. 3.

As illustrated in FIGS. 4 and 5, housing 50 includes positioning member 56 disposed inwardly from cover body 71 of cover 70 described later in second direction Y inside housing 50. Positioning member 56 is made of a magnesium alloy in a plate shape, for example, and includes first recess 57 and second recess 58 each of which is capable of accommodating positioning protrusion 72 of the cover 70 to be described later. First recess 57 and second recess 58 are provided on a surface facing opening 53 in second direction Y, and are disposed side by side along first direction Z.

As illustrated in FIG. 4, first recess 57 is disposed facing positioning protrusion 72 in second direction Y when cover 70 is located at closed position P1, and accommodates positioning protrusion 72. Positioning protrusion 72 of cover 70 located at closed position P1 forms gap 81 with a bottom of first recess 57.

As illustrated in FIG. 5, second recess 58 is disposed facing positioning protrusion 72 in second direction Y when cover 70 is located at open position P2, and accommodates positioning protrusion 72. Positioning protrusion 72 of cover 70 located at open position P2 forms gap 82 with a bottom of second recess 58.

Each of first recess 57 and second recess 58 has an opening edge that is rounded. Each of first recess 57 and second recess 58 has a bottom surface that is curved.

Figure 6:
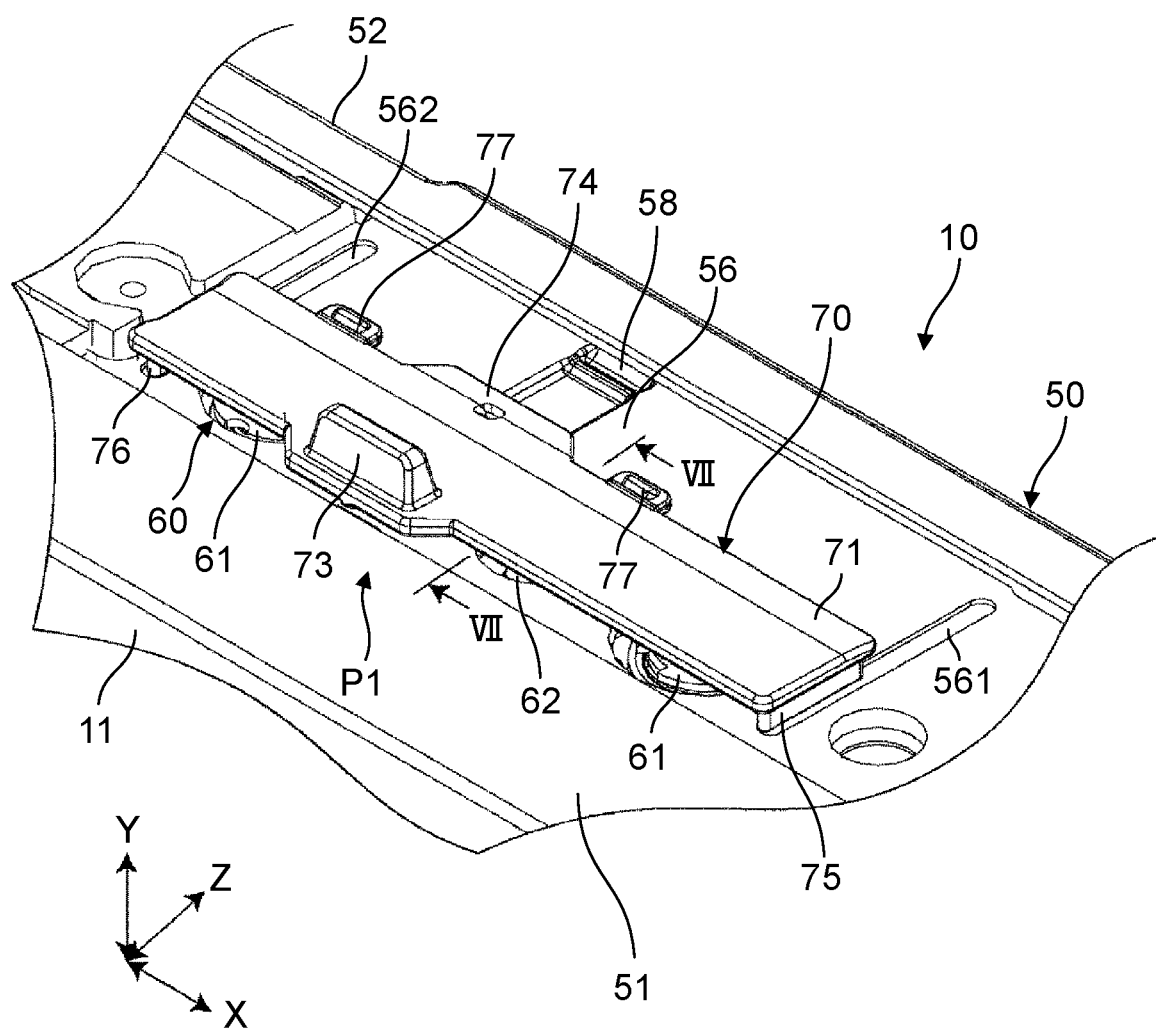
FIG. 6 is a partial perspective view of FIG. 2 in a state where a part of a housing is removed.

As illustrated in FIG. 6, positioning member 56 includes first groove 561 and second groove 562 that are disposed at intervals in third direction X. Between first groove 561 and second groove 562 in third direction X, first recess 57 and second recess 58 are disposed. First groove 561 is disposed facing first guide protrusion 75 of cover 70 described later in second direction Y. First groove 561 extends along first direction Z and accommodates first guide protrusion 75. Second groove 562 is disposed facing second guide protrusion 76 of cover 70 described later in second direction Y. Second groove 562 extends along first direction Z and accommodates second guide protrusion 76.

Electronic component 60 is a compound-eye camera, for example, and lens 61 and LED 62 are exposed from opening 53 to the outside of housing 50 as illustrated in FIG. 3.

As illustrated in FIGS. 4 and 5, cover 70 is attached to housing 50 while being movable along first direction Z between open position P2 and closed position P1. Cover 70 in the present exemplary embodiment includes cover body 71 and positioning protrusion 72. As illustrated in FIG. 6, cover body 71 has a substantially rectangular plate shape extending along first surface 51, and is provided with positioning protrusion 72 at end part 74 that is away from the center of cover body 71 in third direction X toward second guide protrusion 76 and is close to second surface 52 in first direction Z. Positioning protrusion 72 protrudes from cover body 71 toward the inside of housing 50 along second direction Y. Positioning protrusion 72 has a leading end (one end in second direction Y, facing positioning member 56 of housing 50) that is curved.

Figure 7:
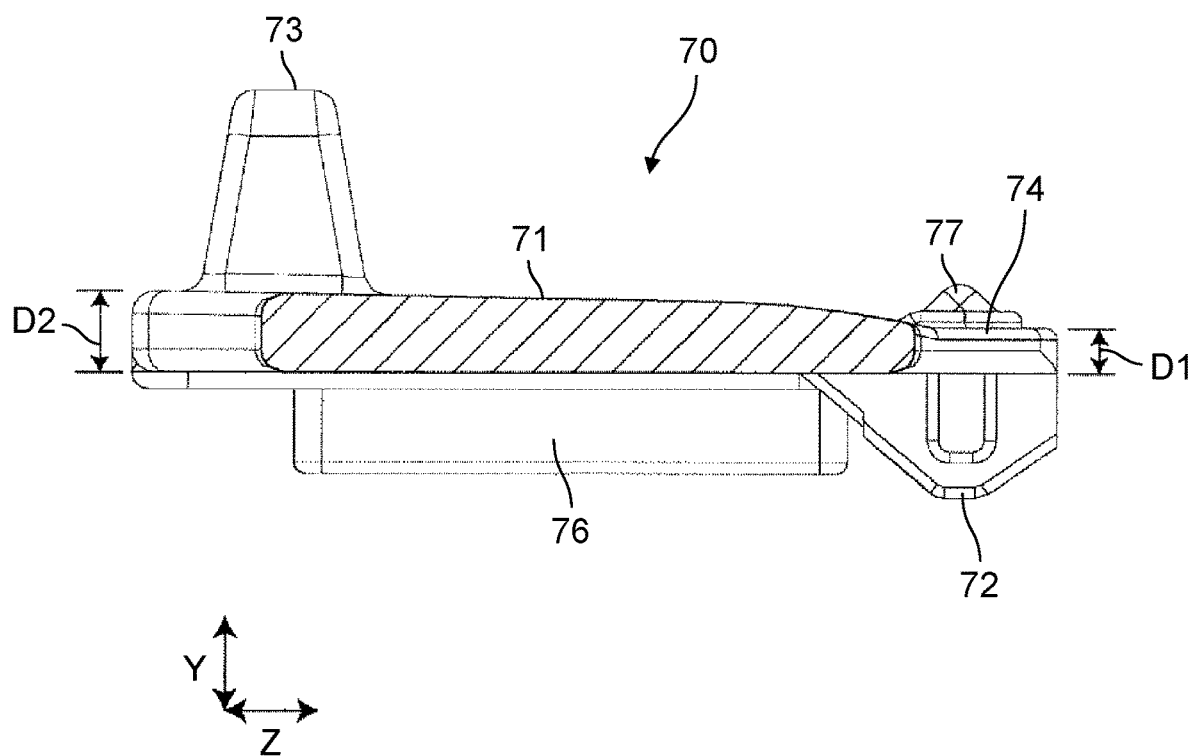
FIG. 7 is a cross-sectional view of the cover of FIG. 6 taken along line VII-VII.

As illustrated in FIG. 7, cover body 71 includes one end (or end part 74) in first direction Z, the one end having dimension D1 in second direction Y smaller than dimension D2 in second direction Y of the other end in first direction Z.

As illustrated in FIG. 6, cover 70 includes first guide protrusion 75 provided at one end of cover body 71 in third direction X intersecting first direction Z and second direction Y, and second guide protrusion 76 provided at the other end of cover body 71 in third direction X. Each of first guide protrusion 75 and second guide protrusion 76 has a substantially rectangular plate shape, for example, and protrudes from cover body 71 toward the inside of housing 50 along second direction Y.

As illustrated in FIGS. 2 and 3, cover 70 includes operation part 73 extending from cover body 71 toward the outside of housing 50 along second direction Y. As illustrated in FIG. 6, operation part 73 has a substantially quadrangular frustum shape, for example, and is disposed at a position away from the center of the cover body 71 in third direction X toward second guide protrusion 76.

As illustrated in FIG. 6, cover 70 includes projection 77 provided at one end of cover body 71 in first direction Z. Cover 70 in the present exemplary embodiment includes two projections 77 that are disposed on corresponding opposite sides in third direction X of positioning protrusion 72. Each of projections 77 protrudes from cover body 71 toward the outside of housing 50 along second direction Y. As illustrated in FIGS. 4 and 5, each of projections 77 overlaps a part around opening 53 of housing 50 when viewed along first direction Z. Each of projections 77 has a leading end (one end in second direction Y, facing first surface 51 of housing 50) that is curved.

Electronic device 1 can exhibit the following effects.

An electronic device has a surface provided with a display, the surface typically having a space in a direction along an outer periphery of the display, the space being larger than a space in a direction intersecting the outer periphery of the display. Thus, an opening is typically formed with a dimension in the direction along the outer periphery of the display, the dimension being larger than a dimension in the direction intersecting the outer periphery of the display. Electronic device 1 includes housing 50, electronic component 60, and cover 70. Housing 50 includes first surface 51 provided with display 11, second surface 52 intersecting first surface 51, and opening 53 provided at a position in first surface 51, the position being between display 11 and second surface 52 in the first direction intersecting second surface 52. Electronic component 60 is disposed inside housing 50 and exposed to the outside of housing 50 through opening 53. Cover 70 is disposed between opening 53 and electronic component 60 in the second direction intersecting first surface 51, and moves along the first direction between closed position P1 where cover 70 closes opening 53 and open position P2 where cover 70 opens opening 53. This configuration enables increasing a space inside housing 50, the space allowing other electronic components to be mounted, by reducing a space required for moving cover 70. As a result, an electronic device having a high degree of freedom in placement of electronic component 60 can be fabricated. For example, even when another electronic component 60 is disposed around electronic component 60, one opening 53 and one cover 70 can be provided for each electronic component 60 to independently expose corresponding electronic component 60 to the outside of housing 50. As a result, opening and closing of opening 53 through which electronic component 60 is exposed can be prevented from affecting the other electronic component 60.

Cover 70 includes cover body 71 extending along first surface 51 and positioning protrusion 72 protruding from cover body 71 toward the inside of housing 50 along the second direction. Housing 50 includes positioning member 56 disposed inside housing 50 and inwardly from cover body 71 in the second direction, positioning member 56 including first recess 57 that accommodates positioning protrusion 72 when cover 70 is located at closed position P1. Such a configuration enables cover 70 to be held at closed position P1.

Positioning protrusion 72 of cover 70 located at closed position P1 forms gap 81 with a bottom of first recess 57. Such a configuration enables cover 70 located at closed position P1 to be more easily moved from closed position P1 toward open position P2.

Cover 70 includes cover body 71 extending along first surface 51 and positioning protrusion 72 protruding from cover body 71 toward the inside of housing 50 along the second direction. Housing 50 includes positioning member 56 disposed inside housing 50 and inwardly from cover body 71 in the second direction, positioning member 56 including second recess 58 that accommodates positioning protrusion 72 when cover 70 is located at open position P2. Such a configuration enables cover 70 to be held at open position P2.

Positioning protrusion 72 of cover 70 located at open position P2 forms gap 82 with the bottom of second recess 58. Such a configuration enables cover 70 located at open position P2 to be more easily moved from open position P2 toward closed position P1.

Positioning protrusion 72 is provided at one end of cover body 71 in the first direction. The one end of cover body 71 in the first direction has a dimension in the second direction, the dimension being smaller than a dimension in the second direction of the other end of cover body 71 in the first direction. Such a configuration allows the end of cover body 71, the end being provided with positioning protrusion 72, to be easily elastically deformed in the second direction, and thus enables cover 70 to be more easily moved between closed position P1 and open position P2.

Cover 70 includes first guide protrusion 75 and second guide protrusion 76. First guide protrusion 75 is provided at one end of cover body 71 in the third direction intersecting the first direction and the second direction, and protrudes from cover body 71 toward the inside of housing 50 along the second direction. Second guide protrusion 76 is provided at the other end of cover body 71 in the third direction, and protrudes from cover body 71 toward the inside of housing 50 along the second direction. Positioning member 56 includes first groove 561 and second groove 562. First groove 561 is disposed facing first guide protrusion 75 in the second direction and accommodates first guide protrusion 75. Second groove 562 is disposed facing second guide protrusion 76 in the second direction and accommodates second guide protrusion 76. Each of first groove 561 and second groove 562 extends along the first direction and guides movement of cover 70 in the first direction. Such a configuration enables cover 70 to be moved more smoothly.

Cover 70 includes operation part 73 extending from cover body 71 toward the outside of housing 50 along the second direction. Operation part 73 is disposed at a position away from the center of cover body 71 in the third direction. Such a configuration enables operation part 73 to be changed in position depending on a configuration of electronic component 60, and thus enables fabricating electronic device 1 with a high degree of freedom in design in which electronic components 60 having various configurations can be used.

Housing 50 includes first cutout 54 and second cutout 55 that are provided in first surface 51. First cutout 54 is connected to opening 53 from one side in the first direction with respect to opening 53, and accommodates operation part 73 when cover 70 is located at closed position P1. Second cutout 55 is connected to opening 53 from the other side in the first direction with respect to opening 53, and accommodates operation part 73 when cover 70 is located at open position P2. Such a configuration enables an operation range of operation part 73 to be expanded, and thus enables improvement in operability of cover 70.

Cover 70 includes projection 77 provided at one end of cover body 71 in the first direction. Projection 77 protrudes from cover body 71 toward the outside of housing 50 along the second direction and overlaps a part around opening 53 of housing 50 when viewed along the first direction. Such a configuration enables preventing cover 70 from lifting.

Electronic device 1 can also be configured as follows.

Electronic device 1 can use any configuration including housing 50 provided with opening 53, electronic component 60 exposed to the outside of housing 50 through opening 53, and cover 70 that opens and closes opening 53. For example, operation part 73 and positioning protrusion 72 of cover 70, and positioning member 56 of the housing, can be eliminated.

One or both of first cutout 54 and second cutout 55 of housing 50 can be eliminated.

One or both of first recess 57 and second recess 58 of positioning member 56 can be eliminated.

First recess 57, second recess 58, and positioning protrusion 72 may be configured such that gap 81, 82 is not formed when cover 70 is located at closed position P1 or open position P2. That is, first recess 57 or second recess 58 may have an inner surface in a shape substantially identical to an outer shape of positioning protrusion 72.

Cover body 71 may be substantially uniform in dimension in the second direction.

One or both of first guide protrusion 75 and second guide protrusion 76 of cover 70 can be eliminated. In this case, first groove 561 and second groove 562 of positioning member 56 can also be eliminated.

Projection 77 of cover 70 can be eliminated.

Any proper combination of the embodiments or modifications among the various exemplary embodiments and modifications may have the effects of the embodiments or modifications. Combination of exemplary embodiments, combination of examples, or combination of exemplary embodiments and examples are possible, and combination of features in different exemplary embodiments or examples are also possible.

Although the present disclosure has been described in connection with a preferable exemplary embodiment with reference to the accompanying drawings, various modifications and corrections are obvious to those skilled in the art. Such modifications and corrections are to be understood as being included within the scope of the present disclosure as set forth in the appended scope of claims unless departing from the scope of the present disclosure.

The present disclosure is widely applicable to electronic devices including notebook personal computers.

What is claimed is:

1. An electronic device comprising:
   a housing including a first surface including a display, a second surface intersecting the first surface, and an opening provided between the display in the first surface and the second surface in a first direction intersecting the second surface;
   an electronic component disposed inside the housing and exposed to an outside of the housing through the opening; and
   a cover that is disposed between the opening and the electronic component in a second direction intersecting the first surface and moves along the first direction between a closed position where the opening is closed and an open position where the opening is opened, wherein
   the cover includes
      a cover body extending along the first surface, and
      a positioning protrusion protruding from the cover body toward an inside of the housing along the second direction, and
   the housing includes a positioning member disposed inwardly from the cover body in the second direction inside the housing and provided with a first recess that accommodates the positioning protrusion when the cover is located at the closed position.

2. The electronic device according to claim 1, wherein the positioning protrusion of the cover located at the closed position forms a gap with a bottom of the first recess.

3. The electronic device according to claim 1, wherein the cover includes
   a cover body extending along the first surface, and
   a positioning protrusion protruding from the cover body toward an inside of the housing along the second direction, and
   the housing includes a positioning member disposed inwardly from the cover body in the second direction inside the housing and provided with a second recess that accommodates the positioning protrusion when the cover is located at the open position.

4. The electronic device according to claim 3, wherein the positioning protrusion of the cover located at the open position forms a gap with a bottom of the second recess.

5. The electronic device according to claim 1, wherein the positioning protrusion is provided at one end of the cover body in the first direction, and
   the one end of the cover body in the first direction has a dimension in the second direction, the dimension being smaller than a dimension in the second direction of another end of the cover body in the first direction.

6. The electronic device according to claim 3, wherein the positioning protrusion is provided at one end of the cover body in the first direction, and
   the one end of the cover body in the first direction has a dimension in the second direction, the dimension being smaller than a dimension in the second direction of another end of the cover body in the first direction.

7. The electronic device according to claim 1, wherein the cover includes
   a first guide protrusion provided at one end of the cover body in a third direction intersecting the first direction and the second direction, the first guide protrusion protruding from the cover body toward the inside of the housing along the second direction, and
   a second guide protrusion provided at another end of the cover body in the third direction, the second guide protrusion protruding from the cover body toward the inside of the housing along the second direction,
   the positioning member includes
      a first groove disposed facing the first guide protrusion in the second direction, the first groove accommodating the first guide protrusion, and
      a second groove disposed facing the second guide protrusion in the second direction, the second groove accommodating the second guide protrusion, and
   each of the first groove and the second groove extends along the first direction to guide movement of the cover in the first direction.

8. The electronic device according to claim 3, wherein the cover includes
   a first guide protrusion provided at one end of the cover body in a third direction intersecting the first direction and the second direction, the first guide protrusion protruding from the cover body toward the inside of the housing along the second direction, and
   a second guide protrusion provided at another end of the cover body in the third direction, the second guide protrusion protruding from the cover body toward the inside of the housing along the second direction,
   the positioning member includes
      a first groove disposed facing the first guide protrusion in the second direction, the first groove accommodating the first guide protrusion, and a second groove disposed facing the second guide protrusion in the second direction, the second groove accommodating the second guide protrusion, and each of the first groove and the second groove extends along the first direction to guide movement of the cover in the first direction.

9. The electronic device according to claim 1, wherein the cover includes an operation part extending from the cover body toward the outside of the housing along the second direction, and the operation part is disposed at a position away from a center of the cover body in the third direction intersecting the first direction and the second direction.

10. The electronic device according to claim 9, wherein the housing includes a first cutout provided in the first surface and connected to the opening from one side in the first direction with respect to the opening, the first cutout accommodating the operation part when the cover is located at the closed position, and a second cutout provided in the first surface and connected to the opening from another side in the first direction with respect to the opening, the second cutout accommodating the operation part when the cover is located at the open position.

11. The electronic device according to claim 3, wherein the cover includes an operation part extending from the cover body toward the outside of the housing along the second direction, and the operation part is disposed at a position away from a center of the cover body in the third direction intersecting the first direction and the second direction.

12. The electronic device according to claim 11, wherein the housing includes a first cutout provided in the first surface and connected to the opening from one side in the first direction with respect to the opening, the first cutout accommodating the operation part when the cover is located at the closed position, and a second cutout provided in the first surface and connected to the opening from another side in the first direction with respect to the opening, the second cutout accommodating the operation part when the cover is located at the open position.

13. The electronic device according to claim 1, wherein the cover includes a projection provided at the one end of the cover body in the first direction, the projection protruding from the cover body toward the outside of the housing along the second direction and overlapping a part around the opening of the housing when viewed along the first direction.

14. The electronic device according to claim 3, wherein the cover includes a projection provided at the one end of the cover body in the first direction, the projection protruding from the cover body toward the outside of the housing along the second direction and overlapping a part around the opening of the housing when viewed along the first direction.

* * * * *